United States Patent
Park et al.

(10) Patent No.: US 9,583,653 B2
(45) Date of Patent: Feb. 28, 2017

(54) SOLAR CELL AND FABRICATION METHOD THEREOF

(71) Applicant: LG ELECTRONICS INC., Seoul (KR)

(72) Inventors: Hyun Jung Park, Seoul (KR); Jin Ho Kim, Seoul (KR)

(73) Assignee: LG ELECTRONICS INC., Seoul (KR)

(*) Notice: Subject to any disclaimer, the term of this patent is extended or adjusted under 35 U.S.C. 154(b) by 219 days.

(21) Appl. No.: 14/490,338

(22) Filed: Sep. 18, 2014

(65) Prior Publication Data

US 2015/0004742 A1   Jan. 1, 2015

Related U.S. Application Data

(62) Division of application No. 12/572,724, filed on Oct. 2, 2009, now abandoned.

(30) Foreign Application Priority Data

Jun. 25, 2009  (KR) ........................ 10-2009-0057155

(51) Int. Cl.
  *H01L 31/028*   (2006.01)
  *H01L 31/0216*  (2014.01)
  (Continued)

(52) U.S. Cl.
  CPC ........ *H01L 31/028* (2013.01); *H01L 31/0232* (2013.01); *H01L 31/02168* (2013.01); *H01L 31/02363* (2013.01); *H01L 31/022425* (2013.01); *H01L 31/068* (2013.01); *H01L 31/1804* (2013.01); *Y02E 10/547* (2013.01); *Y02P 70/521* (2015.11)

(58) Field of Classification Search
  CPC ............. H01L 31/028; H01L 31/02168; H01L 31/022425
  See application file for complete search history.

(56) References Cited

U.S. PATENT DOCUMENTS

| | | |
|---|---|---|
| 5,928,438 A | 7/1999 | Salami et al. |
| 2005/0189013 A1 | 9/2005 | Hartley |
| 2010/0294353 A1 | 11/2010 | Takahashi |

FOREIGN PATENT DOCUMENTS

| | | |
|---|---|---|
| JP | 2000-332282 A | 11/2000 |
| JP | 2006-319335 A | 11/2006 |
| KR | 10-2009-0002947 A | 1/2009 |

*Primary Examiner* — Shannon Gardner
(74) *Attorney, Agent, or Firm* — Birch, Stewart, Kolasch & Birch, LLP (57) ABSTRACT

A fabrication method of a solar cell, the method includes doping a silicon substrate having a first conductive type impurity with a second conductive type impurity, the second conductive type impurity being opposite to the first conductive type impurity, and thereby forming an emitter layer at a front surface part of the silicon substrate, forming an antireflection film on the emitter layer, forming a front electrode on the antireflection film, forming a rear electrode on a rear surface of the silicon substrate, and forming a back surface field layer at a rear surface part of the silicon substrate, the back surface field layer having a concentration of the first conductive type impurity that is higher than that of the silicon substrate, the back surface field layer having a different concentration of the second conductive type impurity from that of the emitter layer.

19 Claims, 7 Drawing Sheets

(51) Int. Cl.
*H01L 31/0232* (2014.01)
*H01L 31/0224* (2006.01)
*H01L 31/068* (2012.01)
*H01L 31/18* (2006.01)
*H01L 31/0236* (2006.01)

SOLAR CELL AND FABRICATION METHOD THEREOF

CROSS-REFERENCE TO RELATED APPLICATIONS

This application is a Divisional of co-pending U.S. application Ser. No. 12/572,724 filed on Oct. 2, 2009, which claims priority under 35 U.S.C §119(a) to Korean Patent Application No. 10-2009-0057155 filed in the Korean Intellectual Property Office on Jun. 25, 2009, all of which are hereby expressly incorporated by reference into the present application.

BACKGROUND OF THE INVENTION

Field of the Invention

The present invention relates to a solar cell and a fabrication method thereof, and more particularly, to a fabrication method of a silicon solar cell, especially, a slim-type solar cell capable of providing a high efficiency at economical unit costs by improving process conditions suitable for a slim-type silicon substrate.

Description of the Related Art

Recently, due to problems such as a rapid rise in oil prices, an environmental problem of the earth, exhaustion of fossil energy, waste treatment in nuclear power generation, location selection according to construction of a new power plant, etc., interest in renewable energy has increased and among others, research and development for a solar cell, which is a pollution-free energy source, has actively proceeded.

A solar cell is advantageous in view of being pollution-free, being a sustainable resource, having a semi-permanent life span, etc., and being expected as a source of energy to allow human beings to ultimately solve the energy problem, without adversely affecting the environment.

Solar cells may be typed as a silicon solar cell, a thin film solar cell, a dye sensitized solar cell, and an organic polymer solar cell, etc., according to their constitutional material. In particular, a crystalline silicon solar cell makes up a majority of the total production of the solar cells in the world over. The crystalline silicon solar cell has a higher efficiency compared to that of other solar cells, and a technique to lower the unit cost of manufacturing crystalline silicon solar cell has continuously progressed, such that the crystalline silicon solar cell may be referred to as the most popular type of solar cell.

Solar cells are generally fabricated to include a p-n junction interface by forming an n-type semiconductor layer on a front surface of a p-type silicon substrate. The n-type semiconductor layer formed on the front surface of the p-type silicon substrate acts as an emitter, wherein an antireflection film of silicon nitride or silicon oxide is coated thereon, and then electrodes are wired in such a way to minimize reflection of light.

Recently, studies that allow the solar cells to have a high photovoltaic efficiency by improving a structure of the emitter in a portion where the front electrode of the solar cell is wired or by controlling a production process of the solar cells have been made.

SUMMARY OF THE INVENTION

The present invention relates to a structure and a process of making a solar cell that includes an emitter for improving photovoltaic efficiency of a crystalline silicon solar cell, as described above. An object of the present invention is to secure cost effective mass production of a high efficiency solar cell by improving upon a fabrication method over a conventional method.

Further, another object of the present invention is to provide a fabrication method of a solar cell that easily forms an emitter layer improved to have an efficient structure on a slim-type silicon substrate, which maintains characteristic reliability and quality, and not hinder the efficiency of the solar cell.

The technical problems to be addressed by this invention are not limited only to the foregoing ones, and others not referred to, but addressable, will be understood by those skilled in the art and apparent from the following description. Other object and advantages are also within the scope of the present invention.

While use of a slim-type solar cell which is easily handled and having many uses has recently spread, the present invention is derived particularly from interest in improving a fabrication process of a slim-type solar cell that includes a method of forming an emitter on a slim-type silicon substrate of 150 µm or less, and improving an efficiency of the slim-type solar cell. The emitter applied to the slim-type solar cell of the present invention includes not only an emitter of a crystalline silicon solar cell similar to those in a related art solar cell, but also a selective emitter where impurity doping concentrations of the emitter are different.

According to an embodiment of the present invention, there is provided a fabrication method of a solar cell, including doping a silicon substrate having a first conductive type impurity with a second conductive type impurity, the second conductive type impurity being opposite to the first conductive type impurity, and thereby forming an emitter layer at a front surface part of the silicon substrate; forming an antireflection film on the emitter layer; forming a front electrode on the antireflection film; forming a rear electrode on a rear surface of the silicon substrate; and forming a back surface field layer at a rear surface part of the silicon substrate, the back surface field layer having a concentration of the first conductive type impurity that is higher than that of the silicon substrate, the back surface field layer having a different concentration of the second conductive type impurity from that of the emitter layer.

According to an embodiment of the present invention, there is provided a solar cell including a silicon substrate doped with a first conductive type impurity; an emitter layer formed at a front surface part of the silicon substrate, the emitter layer having a second conductive type impurity opposite to the first conductive type impurity; an antireflection film formed on the emitter layer; a front electrode formed on the antireflection layer, and which penetrates through the antireflection film to contact the emitter layer; a back surface field layer formed at a rear surface part of the silicon substrate, the back surface field layer being doped with a higher concentration of the first conductive type impurity than that of the silicon substrate, wherein the back surface field layer has a different concentration of the second conductive type impurity from that of the emitter layer; and a rear electrode formed on the back surface field layer.

Accordingly, with the solar cell and the fabrication method thereof according to the present invention, provided is a solar cell that includes a selective emitter having an excellent photovoltaic efficiency by way of improved short-circuit current, open-circuit voltage, and fill factor (FF) values and which is constituted in an ultra-thin form, compared to that of a silicon solar cell of a related art.

With the solar cell and the fabrication method thereof according to the present invention, provided is a high efficiency silicon solar cell having the selective emitter on the slim-type silicon substrate, and being processed at low temperatures, to thereby maintain high quality and reliability.

In addition, the slim-type solar cell can be mass produced through an improvement in the manufacturing process for reduced production costs and reduced production time.

BRIEF DESCRIPTION OF THE DRAWINGS

The above and other objects, features and advantages of the present invention will become apparent from the following description of example embodiments given in conjunction with the accompanying drawings, in which.

DETAILED DESCRIPTION OF THE EMBODIMENTS

Hereinafter, example embodiments of the present invention will be described in detail with reference to the accompanying drawings.

FIGS. 1 to 6 are cross-sectional views showing a fabrication method of a silicon solar cell having an emitter according to an embodiment of the present invention. First, a first conductive type (e.g., a p-type) silicon substrate 1 is doped with a second conductive type (e.g., an n-type) impurity to form a second conductive type (i.e., an n-type) emitter layer 2 on a surface of the first conductive type silicon substrate 1 (hereinafter also referred to as simply a substrate 1). The first conductive type silicon substrate 1 is doped with an impurity species of the first conductive type, which is opposite to an impurity species of the second conductive type that is doped to form the second conductive type emitter layer 2. In embodiments of the present invention, the first conductive type refers to the p-type and the second conductive type refers to the n-type, so that the second conductive type emitter layer 2 is hereinafter referred to as an n-type emitter layer 2.

Figure 1:
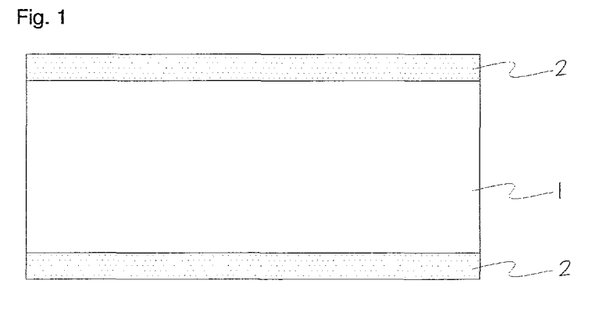
FIGS. 1 to 6 are cross-sectional views showing a fabrication method of a silicon solar cell having an emitter according to an embodiment of the present invention.

Although not shown in FIG. 1, the n-type impurity is doped on both side surfaces as well as a front surface and a rear surface of the silicon substrate 1. The doping layer on the side surfaces of the silicon substrate 1 will be removed later through an edge isolation process, such that only the n-type doping layers 2 and 2a respectively on the front surface and the rear surface is shown in FIG. 1.

The n-type emitter layer 2 on the first surface forms a p-n junction on an interface with the p-type silicon substrate 1. The n-type emitter layer 2a formed on the rear surface of the p-type silicon substrate 1 will be removed later and will not function as an emitter layer. The n-type emitter layer 2a that is removed from the rear surface of the p-type silicon substrate 1 will be referred to as an n-type impurity doping layer 2a. The n-type emitter layers 2 and 2a may be formed using a generally well-known deposition process of an impurity.

Figure 2:
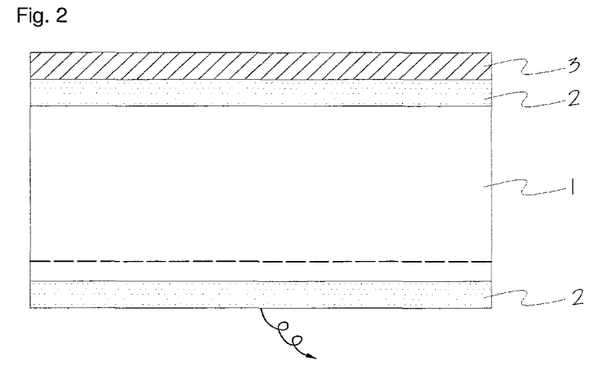

Next, an antireflection film 3 is formed on the n-type emitter layer 2 formed on the front surface of the substrate 1. Although the antireflection film 3 having a single layer is shown in FIG. 2, such is not limiting, and the antireflection film 3 may be formed to have a plurality of layers. Although the material to constitute the antireflection layer 3 is not particularly limited, it may be constituted using a material that reduces or prevents incident light from escaping again to the outside, and may include, a silicon oxide, a silicon nitride, and/or a mixture film thereof.

The material to constitute the antireflection layer 3 may, specifically, use dielectric materials, for example, and may be a single layer of SiNx, a two layer structure of SiNx/SiON or SiNx/SiOx, or a three layer structure of SiOx/SiNx/SiOx, but not necessarily limited thereto. For example, a layer having SiOxNy may be a single layer of, or included, in the antireflection layer 3. Additionally, the antireflection layer 3 functions not only to minimize reflectivity of the solar cell but also as a passivation layer.

In FIG. 2, after the antireflection film 3 is formed, the n-type impurity doping layer 2a formed on the rear surface of the p-type silicon substrate 1 is removed. It is preferable, but not required, to remove or reduce the thickness of the n-type impurity doping layer 2a. It is also preferable, though not required, to not only reduce or remove the thickness of the n-type impurity doping layer 2a, but to further remove a small thickness of the p-type silicon substrate 1 that is next to the n-type impurity doping layer 2a to ensure that the n-type impurity doping layer 2a is completely removed.

The method to reduce or remove the n-type impurity doping layer 2a may be by any known or later developed method, and may include an optical scribing method, a mechanical scribing method, a plasma etching method, a wet etching method, a dry etching method, a lift-off method, and wire mask method, etc., and others.

According to an embodiment of the present invention, the thickness of the p-type silicon substrate 1 may 80 to 180 µm, preferably 100 to 150 µm, though not required, and the p-type silicon substrate 1 with such a thickness may be referred to as a slim-type. As the p-type silicon substrate 1 is thin or slim, the n-type impurity doping layer 2a may be removed using the chemical etching method rather than the mechanical etching method in order to reduce or prevent a mechanical or physical breakage of the p-type silicon substrate 1. Also, the plasma etching method, the wet etching method, and the dry etching method, etc., may be used to reduce or remove the n-type impurity doping layer 2a without the mechanical or physical breakage of the p-type silicon substrate 1.

Figure 3:
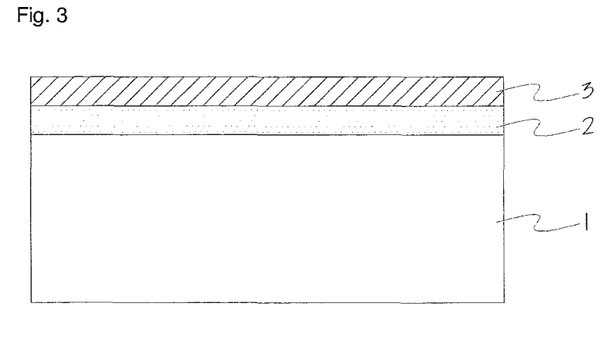

The cross-sectional view of the solar cell where the n-type impurity doping layer 2a is removed from the rear surface of the p-type substrate 1, as described above, is shown in FIG. 3. The thickness of the p-type silicon substrate 1 in FIG. 3 is thinner than a thickness of a silicon substrate in a related art solar cell. Therefore, a slim-type solar cell can be fabricated.

Figure 4:
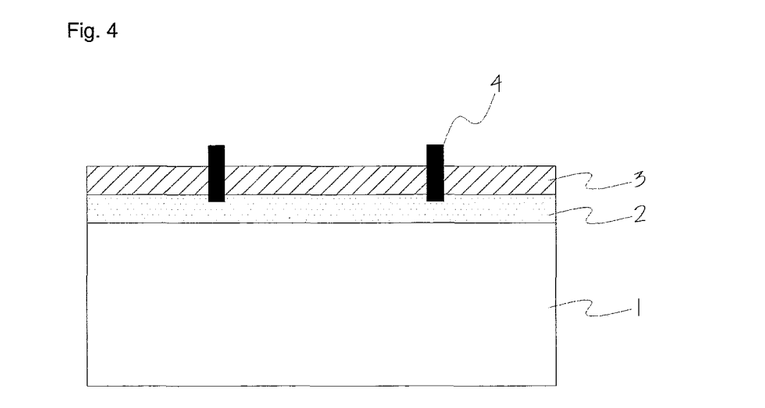

Next, a process of forming a front electrode 4 on a front surface part of the p-type silicon substrate 1 is shown in FIG. 4. The front electrode 4 may use a known method of forming an electrode whereby a front electrode paste such as silver (Ag) is patterned and coated on the antireflection film 3 of the p-type silicon substrate 1. Next, a portion of the front electrode 4 penetrates through the antireflection film 3 by being subject to a thermal process to contact and be connected to the n-type emitter layer 2.

A thermal processing temperature of the front electrode is generally 700 to 850° C. in a non-ultra thin-type silicon substrate. However, when the slim-type silicon substrate of 80 μm to 180 μm thickness is used as in the present invention, the slim-type silicon substrate is subject to the process where the n-type impurity doping layer 2a formed on the rear surface is removed in forming of a slim-type solar cell. Accordingly, the thermal processing temperature for forming the front electrode 4 can be reduced. Preferably, though not required, the front electrode 4 may be formed by processing at a temperature from 600 to 750° C.

Figure 5:
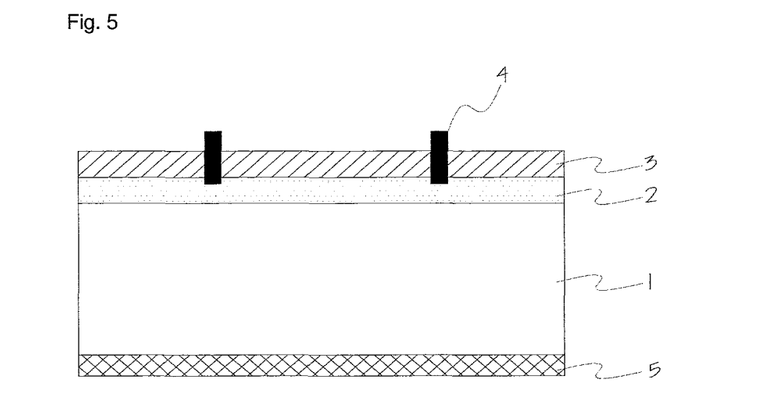

Next, as shown in FIG. 5, a rear electrode 5 is formed on the rear surface of the p-type silicon substrate 1. The rear electrode 5 may use a known or later developed method of forming an electrode, and the rear electrode 5 may be formed together at the same time with the front electrode 4 of FIG. 4, or may be formed at a different time.

The feature that the rear electrode 5 is formed at the same time with the front electrode 4 refers to the respective electrode 4 and 5 being formed by coating pastes that form the front electrode 4 and the rear electrode 5, respectively, and thermally heating the pastes at the same time.

The rear electrode 5 may be formed using a known method, such as a direct printing method, a screen printing method, a plating method, and a coating method, etc. When one of the paste coating method is used, the process of forming the rear electrode 5 includes coating an aluminum (Al) paste, an alloy paste of aluminum and silver (AlAg), etc., and then thermally heating the paste.

Figure 6:
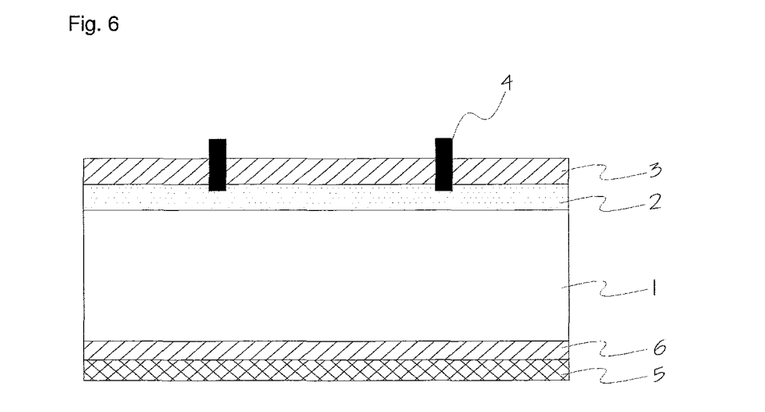

As shown in FIG. 6, the solar cell that is subjected to the thermal process is formed with a back surface field layer 6 on the rear surface of the p-type silicon substrate 1 as a high-concentration doping layer of the p-type impurity. The back surface field layer 6, which is doped with the p-type impurity at a high concentration, serves to induce a pair of electrons and holes that is separated by incident light to be moved and/or separated more easily, and to reduce or prevent the pair of electrons and holes from being re-combined, thereby making it possible to contribute to a high efficiency of the solar cell.

The process up to this point is explained on the assumption that the surface of the p-type substrate 1 is flat. In embodiments of the present invention, before being subject to the thermal process, the surface of the p-type silicon substrate 1 may be imparted with an uneven structure through a texturing process. The uneven structure reduces reflection of the incident light.

The texturing process may use a wet chemical etching method, a dry chemical etching method, an electrical-chemical etching method, a mechanical etching method, etc., which are known, as well as other methods. The thickness of the substrates used in embodiments of the present invention is thing, and the silicon substrates are a slim-type, such that the texturing process is performed without breakage or defect of the substrate by using the chemical etching method rather than the mechanical etching method, though such is not required.

Figure 7:
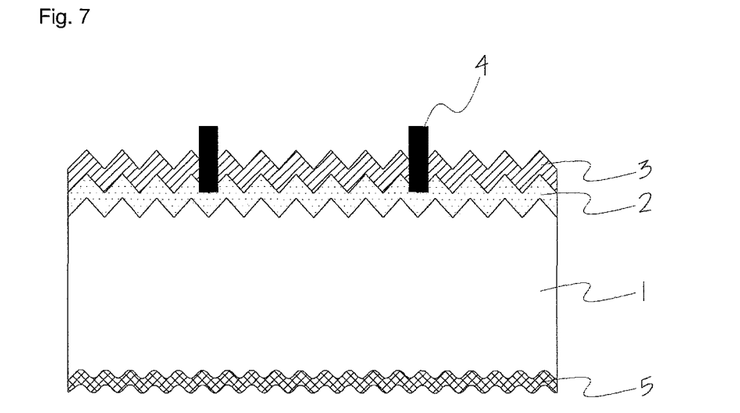
FIGS. 7 and 8 are cross-sectional views of a solar cell fabricated using the fabrication method of a silicon solar cell according to the embodiment of the present invention.

The structure of the solar cell fabricated as the p-type silicon substrate 1 having the uneven structure on the front surface of the substrate, or on both front and rear surfaces thereof using the process as described above, is shown in FIGS. 7 and 8. In FIG. 7, both the front surface and the rear surface of the p-type silicon substrate 1 are textured to be uneven, wherein an unevenness (or a size of an uneven structure) on the rear surface part of the substrate becomes smaller than an unevenness (or a size of an uneven structure) on the front surface part of the substrate 1 during the process of removing the n-type impurity doping layer 2a formed on the rear surface of the substrate 1.

During the process of removing the n-type impurity doping layer 2a, the unevenness on the rear surface part of the substrate 1 may be smaller than the unevenness on the front surface part thereof in view of a size, a frequency, a height, a sharpness, etc., as well as sizes of formed shapes or structures that constitute the uneven structure.

Figure 8:
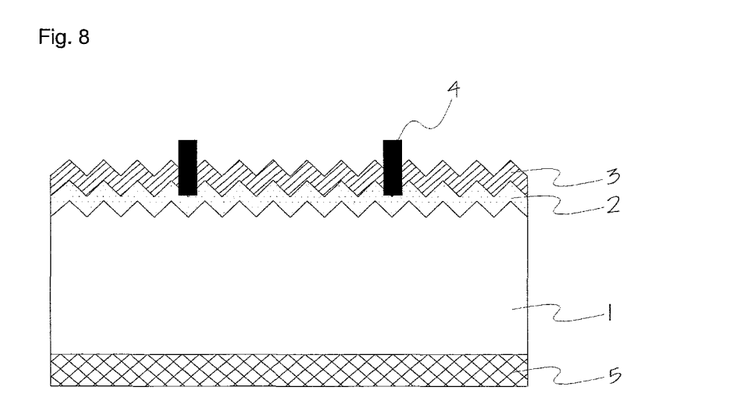

FIG. 8 shows a solar cell that has a flat rear surface as the unevenness is completely removed during the process of removing the n-type impurity doping layer 2a. In the case of the solar cell that includes the unevenness in the substrate as shown in FIGS. 7 and 8, in the same manner, the back surface field layer may also be formed on the interface between the rear surface of the p-type silicon substrate 1 and the rear electrode 5 during the processes of forming and thermally heating the rear electrode 5 (not shown in the drawings).

Hereinafter, as another embodiment of the present invention, a fabrication method of a solar cell that includes a selective emitter will be described.

One fabrication method of a selective emitter layer having portions with differing impurity concentrations in an emitter layer 2 is by way of forming high-concentration impurity portions by first forming an oxide pattern on a silicon substrate using a photolithography process, implanting a high concentration of impurity into the silicon substrate using the oxide pattern as a mask to form the high-concentration impurity portions, and removing the oxide pattern to form a low-concentration impurity layer to overlap the high-concentration impurity portions. Then, an antireflection film is coated on a front surface part, and electrodes are formed on the high-concentration impurity regions on the front surface and/or the rear surface, etc.

Other fabrication method of the selective emitter layer is possible, such as forming the low-concentration impurity layer first, then using the oxide pattern to form the high-concentration impurity portions; deep diffusing the impurity over the surface part, then etching back selective portions of the surface part; or selectively using barrier layer to diffuse the impurity through the barrier layer in forming differing concentration portions.

Referring back to FIG. 8, forming the back surface field layer between the rear electrode 5 and the silicon substrate 1 in the rear surface of the solar cell is additionally performed, making it possible to obtain back surface field effects of the solar cell to reduce or prevent the recombination of electrons and holes, to reduce or prevent leakage current, and to have good or improved ohmic contact.

However, a fabrication method of the selective emitter of a crystalline silicon solar cell with a thick silicon substrate having thickness of 200 μm or more involves annealing being performed at high temperatures and having the back surface field effects of the rear surface field layer formed thereon degraded due to the same impurity doping layer as the emitter layer being formed on the rear surface of the substrate. Thereby an open-circuit voltage and a fill factor (FF) are reduced. Therefore, in a process of forming the selective emitter of an ultra-thin silicon substrate and a fabrication method of a solar cell having the ultra-thin silicon substrate, the following processes are proposed in order to improve the process and/or to address problems of degradation in the substrate quality and in the effects of the back surface field.

FIGS. 9 to 17 are cross-sectional views of a fabrication method of a silicon solar cell having a selective emitter according to another embodiment of the present invention. First, in FIG. 9, a silicon oxide 20 is formed on a p-type (i.e., a first conductive type) silicon substrate 10 doped with a p-type impurity.

Figure 9:
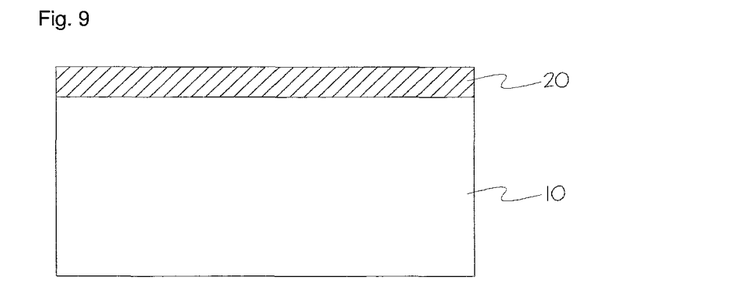
FIGS. 9 to 17 are cross-sectional views of a fabrication method of a silicon solar cell having a selective emitter according to another embodiment of the present invention.

The silicon oxide 20 may be formed using any one of an atmospheric pressure chemical vapor deposition (APCVD) method, a low pressure chemical vapor deposition (LPCVD) method, a plasma enhanced chemical vapor deposition (PECVD) method, a sputtering method, and an electronic beam deposition method. Methods to deposit the silicon oxide 20 are not particularly limited, but the PECVD process is preferable, though not required.

The conductive type of a dopant of the silicon substrate 10 may be an n-type (i.e., a second conductive type) instead of the p-type (i.e., the first conductive type). In other embodiments, the silicon oxide 20 may preferably be silicon dioxide, though not required. At this time, the surface of the silicon substrate 10 may have an uneven structure (or unevenness) by being chemically etched via acidic or alkaline etchants.

However, such a texturing method to form the uneven structure may be performed using a mechanical etching method, such as, a laser irradiation process, etc., and a dry chemical etching process, such as, a reactive ion etching (RIE) process, in addition to the wet chemical etching method.

Figure 10:
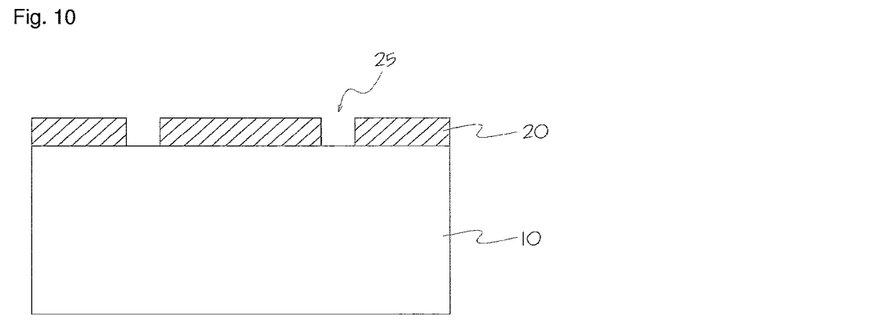

Next, in FIG. 10, an opening part 25 is formed on the silicon oxide 20. The opening part 25 can be formed using a photolithography method that patterns, sensitizes and exposes a photoresist, and/or can be etched using an etching paste. This is the process to be applied to the slim-type silicon substrate, since a mechanical etching, such as, a laser scribing is not recommended, though the mechanical etching process may be used.

Figure 11:
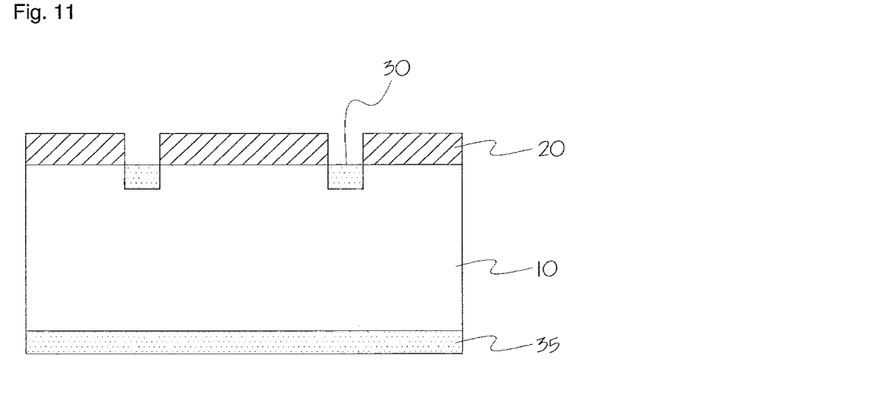

Next, FIG. 11 shows a structure of the solar cell, where a region 30 doped with a high-concentration of the n-type impurity is formed through the opening part 25 by thermally diffusing an n-type impurity in a p-type silicon substrate 10, and a layer 35 doped with the n-type impurity is formed in a lower part of the p-type silicon substrate 10. Although not shown in FIG. 11, such an n-type impurity doped region may also be formed on a side surface part of the p-type silicon substrate 10.

The boundary surface between the region 30 doped with the n-type impurity at the high concentration and the p-type silicon substrate 10 forms a p-n junction interface.

The n-type impurity may include a group-V element material, and may have a diffusion source. The diffusion source for the group-V element may particularly be a dopant gas of phosphorous oxychloride ($POCl_3$), which includes phosphorous (P).

Figure 12:
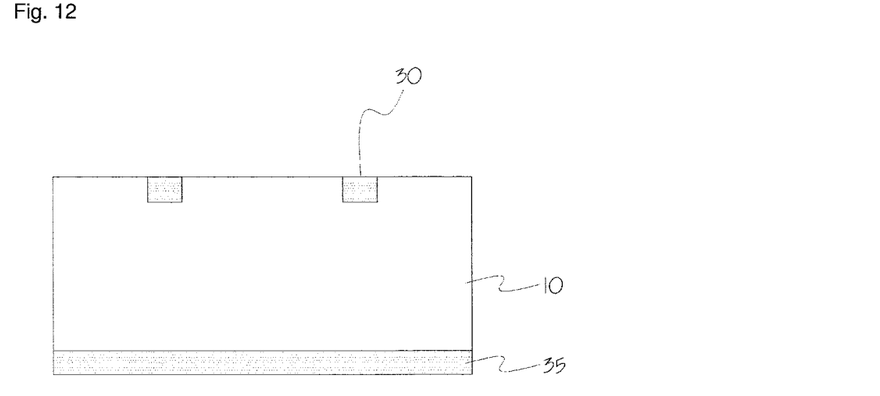

Next, if a silicon oxide 20 having an opening part 25 is removed, a structure as shown in FIG. 12 becomes apparent. The n-type impurity is thermally diffused again in the p-type silicon substrate 10 without the silicon oxide 20, thereby forming a low-concentration n-type impurity region 40 on a front surface part of the p-type silicon substrate 10.

Figure 13:
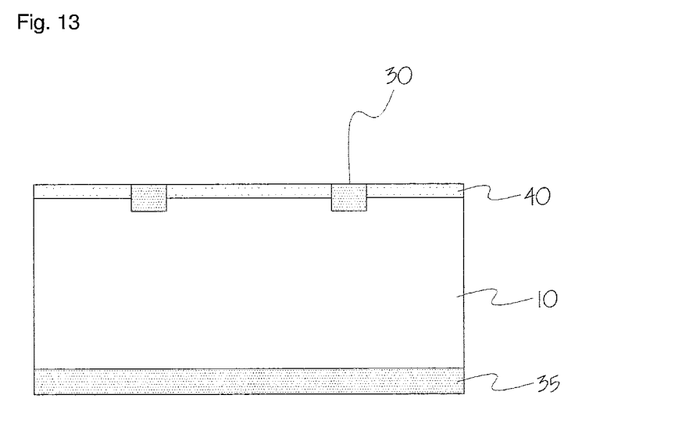

Referring to FIG. 13, the n-type doping concentration of the high-concentration n-type impurity region 30 and the n-type impurity doping layer 35 formed on a rear surface of the substrate will be maintained at a higher concentration by the n-type impurity doping that is performed twice in forming the high-concentration n-type impurity region 30 and the low-concentration n-type impurity region 40 on a front surface part of the p-type silicon substrate 10.

The thermal diffusion processes of the n-type impurity performed in FIGS. 11 and 13 are different in view of the annealing temperature and process time necessary for the thermal diffusion as well as the impurity concentration, making it possible to form the high-concentration n-type impurity region 30 and the low-concentration n-type impurity region 40 on the p-type silicon substrate 10 to desired depths. The high-concentration n-type impurity region 30 and the low-concentration n-type impurity region 40 form the selective emitter layer of the p-type silicon substrate 10 and the solar cell.

Figure 14:
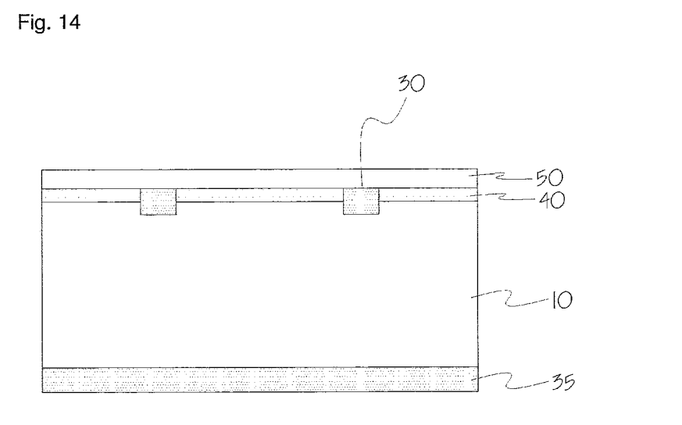

FIG. 14 shows a structure where an antireflection layer (or film) 50 is formed on the selective emitter layer that includes the high-concentration n-type impurity region 30 and the low-concentration n-type impurity region 40. The material to constitute the antireflection layer 50 may be one or more dielectric materials, for example, a single layer of SiNx, a two layer structure of SiNx/SiON or SiNx/SiOx, or a three layer structure of SiOx/SiNx/SiOx, but not necessarily limited thereto. For example, a layer having SiOxNy may be a single layer or included in any one of the structures. The antireflection layer 50 functions not only to minimize reflectivity of the p-type silicon substrate 10 or the solar cell, but also as a passivation layer. The antireflection layer 50 forming a stacked film, as shown in FIG. 14, is proposed as one embodiment, but the antireflection layer 50 may also be formed after the process in FIG. 15 is performed according to varying circumstances.

Figure 15:
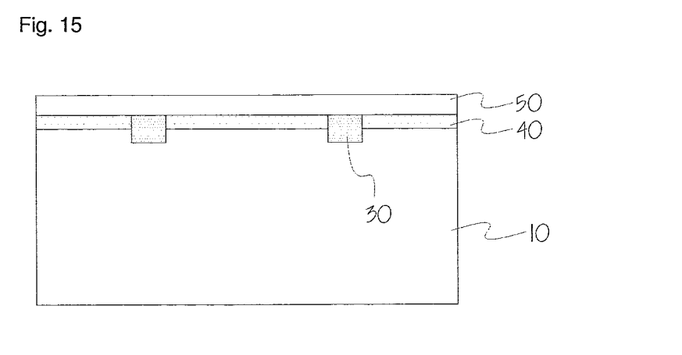

FIG. 15 shows a structure where an n-type impurity doping layer 35 formed on the rear surface of the p-type silicon substrate 10 is reduced or removed during the process of forming the solar cell including the selective emitter. The n-type impurity doping layer 35 is formed on the rear surface of the substrate at a relatively high concentration during the process of forming the selective emitter, such that the process of removing the n-type impurity doping layer 35 is preferred, but not required, in the present invention.

When the n-type impurity doping layer 35 is removed, it facilitates and maximizes a contact between the back surface field layer, to be formed later on the rear surface of the substrate of the solar cell, and the silicon substrate, making it possible to maximize back surface field effects to reduce or prevent the recombination of a pair of electrons-holes. Further, the rear surface of the p-type silicon substrate 10 is planarized to be flat, making it also possible to expect increased effects in an open-circuit voltage Voc. The effect of removing the n-type impurity doping layer 35 from an ultra-thin silicon substrate is especially pronounced, and leads to improvement in the back surface field effects.

According to an embodiment of the present invention, the n-type impurity doping layer 35 formed on the rear surface of the p-type silicon substrate 10 includes group-V elements such as phosphorous (P), arsenic (As), antimony (Sb), etc., but the n-type impurity doping layer 35 is completely removed in this operation, such that the group-V elements do not exist on the back surface field layer and in the rear electrode that contacts the rear surface of the substrate.

In embodiments of the present invention, reference to the group-V elements not existing on the back surface field layer includes presence of the group-V elements in the back surface field layer that is negligible, or presence of the group-V elements in the back surface field layer that is not greater than an incidental contamination of the group-V elements, so that for practical purposes, the presence of the group-V elements can be said to be zero or none.

In embodiments of the present invention, a presence or concentration of the impurities may refer to a presence or concentration in terms of a per unit area, a per unit volume or other known units.

The thickness of the n-type impurity doping layer 35 that is removed in an embodiment of the present invention may be equivalent to or thicker than the thickness of the n-type impurity doping layer formed on the front surface, that is, the thickness of the selective emitter layer that includes the high-concentration n-type impurity region 30 and the low-concentration n-type impurity region 40.

The thickness of the selective emitter layer formed on the front surface part of the p-type silicon substrate 10 through the process is not particularly limited, but the high-concentration doped region 40 may extend 0.2 μm to 3.0 μm from the front surface part of the p-type silicon substrate 10 and the low-concentration doped region 40 may extend 0.1 μm to 0.5 μm from the front surface part of the p-type silicon substrate 10. Therefore, the thickness of the n-type impurity doping layer 35 removed from the p-type silicon substrate 10 on the rear surface may be 0.1 μm at a minimum to 3.5 μm or more at a maximum according to the thickness of the n-type impurity doping layer 35 that was deposited on the rear surface based on the forming process or the doped concentration of n-type impurity. Preferably, the n-type impurity doping layer 35 may be removed to a thickness at which the n-type impurity is not detected from the p-type silicon substrate 10 on the rear surface thereof.

The n-type impurity doping layer 35 formed on the rear surface of the p-type silicon substrate 10 may be removed using an optical scribing method, a mechanical scribing method, a plasma etching method, a wet etching method, a dry etching method, a lift-off method, a wire mask method, etc., and may preferably use an etching method using a wet etchant, or a dry etchant such as plasma, though such is not required.

The etching speed at which the n-type impurity doping layer 35 is removed by the etching method may be varied according to the concentration of the doped impurity, or may be constant. When the etching speed is varied, the wet etchant used may be a composite where nitric acid ($HNO_3$), hydrofluoric acid (HF), acetic acid ($CH_3COOH$), and/or water ($H_2O$) are mixed at volume ratios of 10:0.1-0.01:1-3:5-10. In embodiments of the present invention, the higher the doping concentration of the n-type impurity, the more rapidly the selective wet etchant having such a composition can remove the n-type impurity doping layer 35. The n-type impurity doping layer 35 formed on the rear surface of the p-type silicon substrate 1 may have a higher impurity doped concentration towards the external surface, such that the n-type impurity doping layer 35 is removed at an etching rate of 0.08 to 0.12 μm/sec in a region of the surface doped with a high-concentration of the n-type impurity using the wet etchant.

Once the n-type impurity doping layer 35 is partially removed in the thickness of the high-concentration doped region using the higher etching rate of 0.08 to 0.12 μm/sec, removal of the remainder of the n-type impurity doping layer 35 is completed at a slower etching speed of 0.01 to 0.03 μm/sec. Although not particularly limited, the n-type impurity doping layer 35 may be removed at the high-speed etching rate 0.08 to 0.12 μm/sec for approximately the first 3 seconds of the etching process, and then the remaining portion may be removed at the low-speed etching rate of 0.01 to 0.03 μm/sec, to complete the removal of the n-type impurity doping layer 35.

Figure 16:
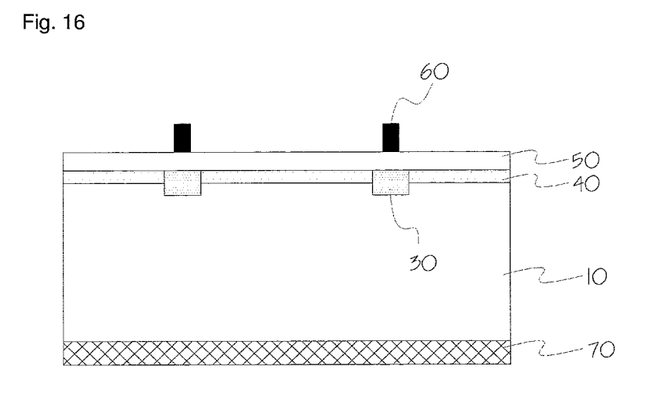

FIG. 16 shows a structure where a front electrode paste 60 and a rear surface paste 70 are applied to or printed and formed in order to form respective front and back electrodes respectively on a front surface part and a rear surface part of the p-type silicon substrate 10 of the solar cell. The front electrode paste 60 is patterned and formed on an upper part of the selective emitter using a direct printing method or a screen printing method. Accordingly, the front electrode paste 60 is formed over the high-concentration n-type impurity region 30.

The front electrode paste 60 may be thermally heated at the same time with the rear surface paste 70, or at different times with the rear surface paste 70, to infiltrate into the p-type silicon substrate 10 of the solar cell. Although an annealing temperature for forming an electrode is generally 700 to 850° C., when the slim-type silicon substrate of thickness 80 μm to 180 μm is used as in the present invention, due to p-type silicon substrate 10 being thin or slim from having the n-type impurity doping layer 35 formed on the rear surface removed, the temperature for forming the front electrode and/or the rear electrode can be lowered.

Preferably, though not required, the respective front and rear electrodes can be formed by co-firing the electrode pastes 60 and 70 during the thermal process at temperatures of 600 to 750° C. In other embodiments, the respective front and rear electrodes can be formed by firing the respective electrode pastes 60 and 70 during different thermal processes. The temperatures during each of the thermal processes may be 600 to 750° C., or other temperatures. Accordingly, the rear electrode may be formed by a separate process.

Figure 17:
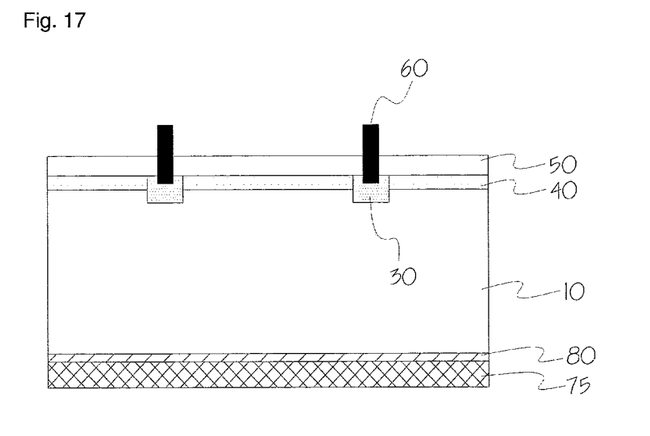

FIG. 17 shows a solar cell completed by way of a fabrication method of a solar cell according to an embodiment of the present invention. Referring to FIG. 17, a front electrode paste 60 is infiltrated into the antireflection film 50 through a thermal process to contact the high-concentration impurity region 30 of the selective emitter layer, to thereby form a front electrode 65, which is also referred to as a finger electrode.

Meanwhile, the rear electrode paste 70 printed on a rear surface of the p-type silicon substrate 10, which may be an aluminum paste or an alloy paste of aluminum and silver, is diffused through the thermal process so that a back surface field layer 80 is formed on the rear surface part of the p-type silicon substrate 10 as a high-concentration doping layer of a p-type impurity. After the thermal process, the back electrode 75 is formed from the rear electrode paste 70 at the same time the back surface field layer 80 is formed on the rear surface part. In other embodiments, the back surface field layer 80 may be formed at a different time from when the back electrode 75 is formed.

According to this embodiment of the present invention, the n-type impurity doping layer 35 on the rear surface of the p-type silicon substrate 10 is removed, making it possible to maximize back surface field effects of the back surface field layer 80 and to increase open-circuit voltage.

Additionally in this embodiment of the present invention, since the n-type impurity doping layer 35 on the rear surface of the p-type silicon substrate 10 is removed, the back surface field layer 80, that is formed after the removal of the n-type impurity doping layer 35, has a different concentration of the second conductive type impurity from that of the emitter layer or the selective emitter layer. That is, the back surface field layer 80 has a different concentration of the second conductive type impurity (e.g., the n-type impurity) from that of at least one of the high-concentration impurity region 30 and the low-concentration n-type impurity region 40. Such would not be the case if the n-type impurity doping layer 35 was not reduced or removed before the back surface field layer 80 is formed.

Figure 18:
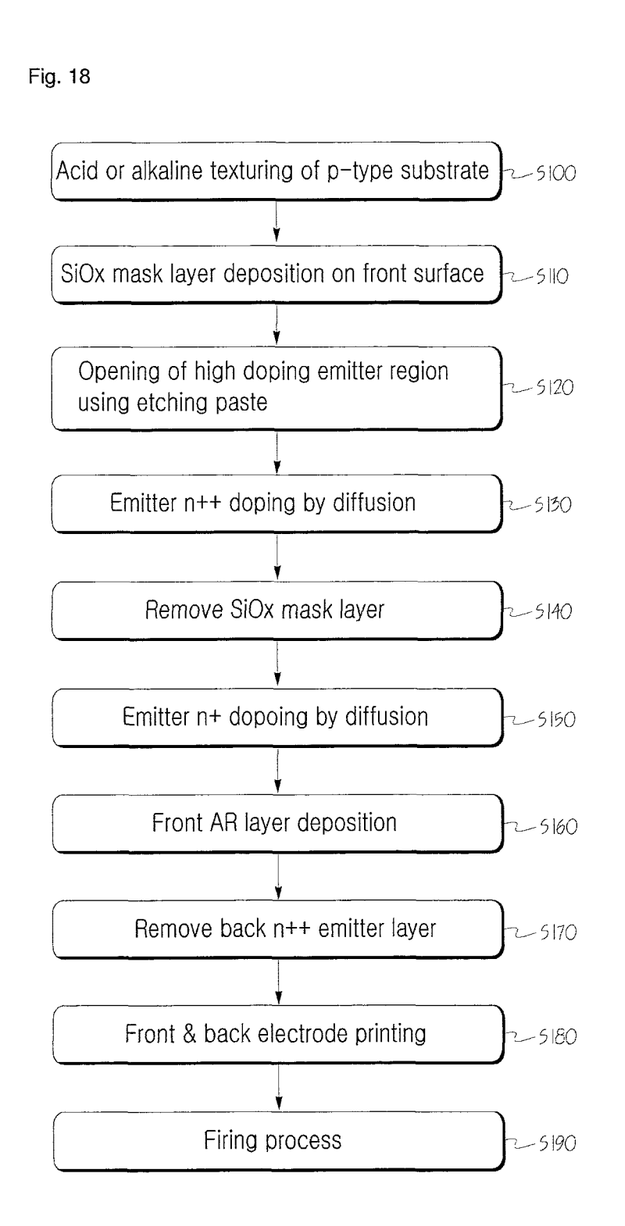
FIG. 18 is a flowchart showing processes of a fabrication method of a silicon solar cell according to the embodiment of the present invention.

FIG. 18 is a flowchart showing processes of a fabrication method of a silicon solar cell according to an embodiment of the present invention. Detailed description of the fabrication method has been described with reference to FIGS. 9-17 so that redundant explanation for each operation will be omitted.

Referring to the fabrication method of FIG. 18, a solar cell formed from the fabrication method as shown is but one example, and is not necessarily limited thereto. Therefore, a process of forming an antireflection film in operation S160 and a process of removing an n-type impurity doping layer formed on a rear surface of a silicon substrate in operation S170 are not restricted to the order shown, but may be changed or switched with other operations or with each other.

In the same manner, a process of printing front surface and rear electrode pastes in operation S180 and a process of thermally heating the front surface and the rear electrode pastes in S190 are not restricted to the order shown, but may be changed or switched with other operations.

Experimental Example

Experimental examples of the fabrication method of the solar cell according to the present invention are as follows. In other words, a slim-type solar cell according to the fabrication method of the present invention and a solar cell having a general or a conventional thickness according to a method in the related art are fabricated by differentiating experimental conditions as shown in the table below and the efficiencies thereof are measured.

Reviewing the experimental conditions in Table 1, the thickness of the silicon substrate, which is subjected to the fabrication method of the solar cell according to the present invention, is 140 μm. Accordingly, the silicon substrate is referred to as a slim-type.

Among the comparative examples, solar cells in comparative examples 1 and 2 have the thickness of the general solar cell, 220 μm, and solar cells in other comparative examples 3 and 4 have an ultra-thin thickness (i.e., 140 μm). Comparative examples 3 and 4 respectively disclose solar cells where a single emitter layer and a selective emitter layer are formed on a substrate having a thickness of 220 μm.

Comparative examples 1 and 2 disclose slim-type solar cells having a silicon substrate with a thickness of 140 μm as shown in the experimental example of the present invention, wherein they respectively include a single emitter layer and a selective emitter layer. Experimental examples 5 and 6 also disclose slim-type solar cells having a silicon substrate with a thickness of 140 μm, wherein comparative example 5 includes a single emitter layer and comparative example 6 includes a selective emitter layer, and the n++ emitter layer (e.g., a high-concentration n-type impurity layer) formed on the rear surface of the substrate is removed only from experimental example 6 among the examples.

The comparative examples and the experimental examples of the present invention are all designed to have a textured structure by having the surface of the front surface substrate etched with an etchant, for example, an acid. It can be appreciated that the antireflection film is stacked on the front surface in all of the examples and there is no significant difference in the examples for other processes.

The method to pattern the opening part (such as opening part 35 in FIG. 10) on the front surface of the silicon substrate of the solar cell does not correspond to the examples having a single emitter layer, but corresponds to the examples having the selective emitter layer. For the examples having the selective emitter layer, there is no difference in the process of forming the opening part.

Parameters that affect the efficiency and the reliability of the solar cells fabricated for the examples as above, such as short-circuit current Isc, open-circuit voltage Voc, and fill factor (FF) values, are also measured.

The experimental results of the solar cells obtained by experiments with the conditions shown in Table 1 are represented by Table 2 below.

TABLE 1

| | Comparative examples | | | | Experimental examples | |
| --- | --- | --- | --- | --- | --- | --- |
| Experimental condition | 1. Thick substrate (thickness ~220 μm) | 2. Thick substrate (thickness ~220 μm) | 3. Thin substrate (thickness ~140 μm) | 4. Thin substrate (thickness ~140 μm) | 5. Thin substrate (thickness ~140 μm) | 6. Thin substrate (thickness ~140 μm) |
| Front surface part | Acid Etching | Acid Etching | Acid Etching | Acid Etching | Acid Etching | Acid Etching |
| Emitter doping | homogeneous | selective | homogeneous | selective | homogeneous | selective |
| Front surface patterning method (forming opening part) | None | Etching paste | None | Etching paste | None | Etching paste |
| Front surface antireflection layer | SiNx layer | SiNx layer | SiNx layer | SiNx layer | SiNx layer | SiNx layer |
| Whether rear surface n++ emitter is removed | Non-remove | Non-remove | Non-remove | Non-remove | Non-remove | Remove |
| Ag & Al electrode forming method | Printing method | Printing method | Printing method | Printing method | Printing method | Printing method |

TABLE 2

| Cell parameter | Comparative examples | | | | Experimental examples | |
|---|---|---|---|---|---|---|
| | 1. FZ mono Thick wafer (thickness ~220 μm) | 2. FZ mono Thick wafer (thickness ~220 μm) | 3. FZ mono Thin wafer (thickness ~140 μm) | 4. FZ mono Thin wafer (thickness ~140 μm) | 5. CZ mono Thin wafer (thickness ~140 μm) | 6. CZ mono Thin wafer (thickness ~140 μm) |
| Jsc (mA) | 33.8 | 34.59 | 33.75 | 34.20 | 33.4 | 34.87 |
| Voc (V) | 0.621 | 0.631 | 0.615 | 0.619 | 0.609 | 0.628 |
| Fill Factor (%) | 77.70 | 78.0 | 77.40 | 76.8 | 79.13 | 78.38 |
| Efficiency (%) | 16.34 | 17.02 | 16.1 | 16.3 | 16.1 | 17.2 |

Reviewing the efficiency from the table of experimental results, it can be appreciated that the efficiency of comparative example 2 and experimental example 6 where the selective emitter is formed is relatively high.

As can be appreciated by comparing comparative examples 1 and 2, for the thick wafer, the cell efficiency is increased due to the application of the selective emitter layer technique, although the n++ emitter layer formed on the rear surface is not removed. However, comparing comparative examples 3 and 4, it can be appreciated, for the thin or slim wafer, the effects of the application of the selective emitter technique is not significant when the n++ emitter layer formed on the rear surface is not removed.

Therefore, for the thin or slim wafer, as can be appreciated from the comparison of experimental examples 5 and 6, the effects of the application of the selective emitter technique are increased when the n++ emitter layer formed on the rear surface is removed as in the embodiments of the present invention.

In other words, it can be appreciated that the efficiency of 17.2% in experimental example 6 is the most excellent. This is shown by the short-circuit current and open-circuit voltage being 34.87 mA and 0.628V, respectively, which are relatively higher than other data by removing the n++ emitter layer formed on the rear surface substrate, differently from other experimental conditions, the entire photovoltaic rate becomes high.

In embodiments of the invention, approximately zero refers to a concentration an impurity which results from unavoidable or unintended inclusion of the impurity. For example, when referencing the second conductive type (or n-type) impurity, it refers to inclusion of the second conductive type impurity when the process to remove the rear emitter portion is not fully completed, or the unintended inclusion of a small amount of the second conductive type impurity. Additional, it also refers to a concentration of the second conductive type impurity that has the same or similar effect or characteristic as when the concentration of the second conductive type impurity is zero.

In embodiments of the present invention, reference to the thickness of the substrate, the p-type silicon substrate, or first conductive type silicon substrate may be a thickness that includes the emitter layer, the selective emitter layer and/or the back surface field layer. In other embodiments, one or more of the emitter layer, the selective emitter layer and/or the back surface field layer need not be included when referencing the thickness of the substrate, the p-type silicon substrate, or first conductive type silicon substrate.

In embodiments of the present invention, a reference to a first type impurity silicon substrate, a p-type silicon substrate or a silicon substrate is made throughout. Nevertheless, embodiments of the present invention are intended to include non-silicon substrates as well, such as any semiconductor substrate, whether they be inherent, compound, or doped, and others.

Those skilled in the art will appreciate that various modifications and variations can be made in the embodiments of the present invention without departing from the spirit or scope of the embodiments of the present invention. Also, the substances of each constituent explained in the specification can be easily selected and processed by those skilled in the art from various known substances. Also, those skilled in the art can remove a part of the constituents as described in the specification without deterioration of performance or can add constituents for improving the performance. Furthermore, those skilled in the art can change the order to methodic steps explained in the specification according to environments of processes or equipment. Thus, it is intended that the present invention covers the modifications and variations of this invention provided they come within the scope of the appended claims and their equivalents.

The invention claimed is:

1. A fabrication method of a solar cell, the method comprising:
   doping a silicon substrate having a first conductive type impurity with a second conductive type impurity, the second conductive type impurity being opposite to the first conductive type impurity, and thereby forming an emitter layer at a front surface part of the silicon substrate;
   forming an antireflection film on the emitter layer;
   forming a front electrode on the antireflection film;
   forming a rear electrode on a rear surface of the silicon substrate; and
   forming a back surface field layer at a rear surface part of the silicon substrate, the back surface field layer having a concentration of the first conductive type impurity that is higher than that of the silicon substrate, the back surface field layer having a different concentration of the second conductive type impurity from that of the emitter layer,
   wherein the forming of the back surface field layer includes removing at least a portion of a second conductive type impurity doping layer formed at the rear surface part of the silicon substrate.

2. The fabrication method of a solar cell according to claim 1, wherein the back surface field layer does not include the second conductive type impurity.

3. The fabrication method of a solar cell according to claim 1, wherein the first conductive type impurity of the back surface field layer is aluminum (Al).

4. The fabrication method of a solar cell according to claim 1, wherein the forming of the front electrode comprises coating a front electrode paste to a front surface of the silicon substrate and annealing the front electrode paste to connect to the emitter layer and form the front electrode.

5. The fabrication method of a solar cell according to claim 1, wherein the forming of the rear electrode comprises coating a rear electrode paste to the rear surface of the silicon substrate and annealing the rear electrode paste to form the rear electrode and the back surface field layer.

6. The fabrication method of a solar cell according to claim 1, wherein the forming of the front electrode and the rear electrode comprises coating a front electrode paste and a rear electrode paste, and annealing the front electrode paste and the rear electrode paste in temperatures from 600 to 750° C. at the same time.

7. The fabrication method of a solar cell according to claim 1, further comprising texturing the silicon substrate to form an unevenness on a front surface or on the front surface and the rear surface of the silicon substrate.

8. The fabrication method of a solar cell according to claim 7, wherein, when the unevenness is formed on the front surface and the rear surface, the forming of the back surface field layer includes reducing or removing the unevenness formed on the rear surface of the silicon substrate.

9. The fabrication method of a solar cell according to claim 1, wherein the removing of the at least a portion of the second conductive type impurity doping layer comprises removing the second conductive type impurity doping layer and a portion of the silicon substrate at the rear surface part of the first conductive type silicon substrate.

10. The fabrication method of a solar cell according to claim 1, wherein the forming of the emitter layer includes forming a first region where the second conductive type impurity has a first concentration and a second region where the second conductive type impurity has a concentration higher than the first concentration, and
wherein the first region of the emitter layer is thinner than the second region of the emitter layer.

11. The fabrication method of a solar cell according to claim 10, wherein the forming of the emitter layer further includes forming a mask layer on a front surface of the silicon substrate and forming a predetermined opening part in the mask layer;
forming the second region through the predetermined opening part; and
forming the first region after removing the mask layer.

12. The fabrication method of a solar cell according to claim 11, wherein the forming of the mask layer deposits a silicon oxide layer on the silicon substrate.

13. The fabrication method of a solar cell according to claim 12, wherein the deposition of the silicon oxide layer is performed using at least one of an atmosphere pressure chemical vapor deposition (APCVD) method, a low pressure chemical vapor deposition (LPCVD) method, a plasma enhanced chemical vapor deposition (PECVD) method, a sputtering method, and an electronic beam deposition method.

14. The fabrication method of a solar cell according to claim 11, wherein the forming of the predetermined opening part in the mask layer includes coating an etching paste on a predetermined region of the mask layer and etching the etching paste.

15. The fabrication method of a solar cell according to claim 11, wherein the forming of the predetermined opening part in the mask layer is performed by at least one of a photolithography method, an optical scribing method, a mechanical scribing method, a plasma etching method, a wet etching method, a dry etching method, a lift-off method, and a wire mask method.

16. The fabrication method of a solar cell according to claim 11, wherein the forming of the second region and the first region comprises thermally diffusing different impurity doping concentrations of the second conductive type impurity in temperatures from 800 to 950° C. for 20 to 100 minutes.

17. The fabrication method of a solar cell according to claim 11, wherein the forming of the second region includes thermally diffusing the second conductive type impurity at a higher temperature and for a longer time than when forming the first region.

18. The fabrication method of a solar cell according to claim 1, wherein the removing of the at least a portion of the second conductive type impurity doping layer formed on the rear surface part of the silicon substrate is performed using at least one of an optical scribing method, a mechanical scribing method, a plasma etching method, a wet etching method, a dry etching method, a lift-off method, and a wire mask method.

19. The fabrication method of a solar cell according to claim 1, wherein removing of the at least a portion of a second conductive type impurity doping layer obtains a thickness of the first conductive type silicon substrate that is 100 μm to 150 μm.

* * * * *